United States Patent [19]

Deguchi

[11] Patent Number: 5,648,975
[45] Date of Patent: Jul. 15, 1997

[54] METHOD AND DEVICE FOR GENERATING TEST PATTERNS FOR TESTING INTEGRATED CIRCUIT

[75] Inventor: Chikahiro Deguchi, Yokohama, Japan

[73] Assignee: Fujitsu Limited, Kawasaki, Japan

[21] Appl. No.: 595,508

[22] Filed: Feb. 1, 1996

Related U.S. Application Data

[63] Continuation of Ser. No. 236,031, May 2, 1994, abandoned.

[30] Foreign Application Priority Data

Aug. 10, 1993 [JP] Japan ..................... 5-198203

[51] Int. Cl.$^6$ .............................................. G01R 31/3181
[52] U.S. Cl. ..................................... 371/27; 371/22.1
[58] Field of Search ........................... 371/27, 22.1, 24

[56] References Cited

U.S. PATENT DOCUMENTS

| | | | |
|---|---|---|---|
| 4,745,355 | 5/1988 | Eichelberger et al. | 324/73 |
| 4,862,399 | 8/1989 | Freeman | 364/580 |
| 5,159,600 | 10/1992 | Chintapalli et al. | 371/27 |
| 5,257,268 | 10/1993 | Agrawal et al. | 371/27 |
| 5,291,495 | 3/1994 | Udell, Jr. | 371/22.3 |
| 5,345,450 | 9/1994 | Saw et al. | 371/27 |
| 5,430,736 | 7/1995 | Takeoka et al. | 371/23 |

*Primary Examiner*—Emanuel T. Voeltz
*Assistant Examiner*—Patrick J. Assouad
*Attorney, Agent, or Firm*—Staas & Halsey

[57] ABSTRACT

A method and apparatus for selecting test patterns of a plurality of groups of test patterns for testing parts of an integrated circuit. The plurality of groups of test patterns are applied to the parts of the integrated circuit to determine which parts are detected by the plurality of groups of test patterns. The detected parts form a group of parts. Each of the groups of test patterns is selectively identified as either necessary or unnecessary by repeatedly referring to the group of parts. Each time a respective group of test patterns is determined to be necessary, the group of parts is reduced by the parts detected by the respective group of test patterns determined to be necessary. After each of the groups of test patterns has been identified as either necessary or unnecessary, the unnecessary groups of test patterns are eliminated, to form a set of remaining necessary groups of test patterns for testing the integrated circuit.

8 Claims, 6 Drawing Sheets

FIG.3 PRIOR ART

| TEST NAME (NUMBER OF TEST PATTERNS) | a | b | c | d | e | f | g | h | i | j | k | l | m |
|---|---|---|---|---|---|---|---|---|---|---|---|---|---|
| FN1 (50P) |  | ○ |  | ○ | ○ |  |  |  |  |  |  |  |  |
| FN2 (50P) |  |  |  | ○ |  | ○ |  |  | ○ |  |  |  |  |
| FN3 (30P) |  | ○ |  |  |  |  |  |  |  | ○ | ○ |  |  |
| FN4 (20P) |  |  |  |  |  |  |  |  |  |  |  |  |  |
| FN5 (20P) |  |  |  | ○ | ○ |  |  | ○ |  |  |  |  |  |
| FN6 (40P) |  |  |  |  | ○ |  |  |  |  | ○ | ○ |  |  |
| FN7 (50P) | ○ | ○ |  | ○ |  | ○ |  |  | ○ |  |  |  |  |

FIG.7

| TEST NAME (NUMBER OF TEST PATTERNS) | a | b | c | d | e | f | g | h | i | j | k | l | m |
|---|---|---|---|---|---|---|---|---|---|---|---|---|---|
| FN1 (50P) |  | ⊕ |  | ⊕ | ⊕ |  |  |  |  |  |  |  |  |
| FN2 (50P) |  |  |  | ⊕ |  | ⊕ |  | ⊕ |  |  |  |  |  |
| FN3 (30P) |  | ○ |  |  |  |  |  |  |  | ○ | ○ |  |  |
| ~~FN4 (20P)~~ |  |  |  |  |  |  |  |  |  |  |  |  |  |
| ~~FN5 (20P)~~ |  |  |  | ⊕ | ⊕ |  |  | ⊕ |  |  |  |  |  |
| FN6 (40P) |  |  |  | ⊕ |  |  |  |  |  | ○ | ○ |  |  |
| ~~FN7 (50P)~~ | ⊕ | ⊕ |  | ⊕ |  | ⊕ |  |  | ⊕ |  |  |  |  |

INVALID — FN4
VALID — FN5
VALID — FN7

FIG.8

| TEST NAME (NUMBER OF TEST PATTERNS) | a | b | c | d | e | f | g | h | i | j | k | l | m |
|---|---|---|---|---|---|---|---|---|---|---|---|---|---|
| ~~FN1 (50P)~~ |  | ⊕ |  | ⊕ | ⊕ |  |  |  |  |  |  |  |  |
| ~~FN2 (50P)~~ |  |  |  | ⊕ |  | ⊕ |  | ⊕ |  |  |  |  |  |
| ~~FN3 (30P)~~ |  | ⊕ |  |  |  |  |  |  |  | ⊕ | ⊕ |  |  |
| ~~FN4 (20P)~~ |  |  |  |  |  |  |  |  |  |  |  |  |  |
| ~~FN5 (20P)~~ |  |  |  | ⊕ | ⊕ |  |  | ⊕ |  |  |  |  |  |
| FN6 (40P) |  |  |  | ⊕ |  |  |  |  |  | ○ | ○ |  |  |
| ~~FN7 (50P)~~ | ⊕ | ⊕ |  | ⊕ |  | ⊕ |  |  | ⊕ |  |  |  |  |

INVALID — FN1
INVALID — FN2
VALID — FN3
INVALID — FN4
VALID — FN5
VALID — FN7

METHOD AND DEVICE FOR GENERATING TEST PATTERNS FOR TESTING INTEGRATED CIRCUIT

This application is a continuation of application Ser. No. 08/236,031, filed May 2, 1994, now abandoned.

BACKGROUND OF THE INVENTION

1. Field of the Invention

The present invention generally relates to a method and device for generating test patterns used to test an integrated circuit such as an LSI (Large Scale Integrated) circuit. More particularly, the present invention is concerned with a method and device for efficiently generating a reduced number of test patterns making it possible to efficiently detect a defect in the LSI circuit without decrease in the reliability in defect detection.

2. Description of the Prior Art

FIG. 1 is a block diagram of a conventional test pattern generating device using an LSI simulator. The device shown in FIG. 1 is made up of a test pattern generating unit 1, an LSI simulator 2, a simulation result file 3 and a test pattern decision unit 4. The test pattern generating unit 1 generates test patterns. The LSI simulator 2 simulates an LSI circuit to be tested. The simulation result file 3 stores the results of the simulation, that is, the results of a decision on the output patterns obtained when the test patterns are applied to the LSI simulator 2. The test pattern decision unit 4 detects a defect in the LSI circuit on the basis of the output patterns output by the LSI simulator 2 by referring to the contents of the simulation result file 3.

FIG. 2 is a waveform diagram of test patterns generated by the test pattern generating unit 1. A reset signal RESET is generated by the test pattern generating unit 1, and resets sequential circuits such as flip-flops of LSI circuits of the LSI simulator 2 to initialize the flip-flops each time the reset signal RESET is switched to a low level. After the flip-flops are reset by the reset signal RESET, patterns A, B, . . . generated by the test pattern generating unit 1 are applied to terminals of the LSI circuits simulated by the LSI simulator 2. FIG. 2 also shows changes of the state of a flip-flop FF in response to the test patterns.

FIG. 3 is a diagram showing test patterns for use in detection of defects and defect detection object parts detected by the test patterns. In FIG. 3, FN1 through FN7 denote the names of the tests, and the numerals added to the character "P" in the parentheses denote the numbers of patterns of the related tests. A group of test patterns in each of the tests is supplied to the LSI simulalor 2 after the LSI simulator 2 is reset by the reset signal RESET shown in FIG. 2. In other words, a group of test patterns in each of the tests is supplied to the LSI simulator 2 while the reset signal is continuously at the high level after it is switched to the high level from the low level. Further, in FIG. 3, "a" through "m" denote the defect detection object parts. In other words, it is determined whether or not the defect detection object parts "a" through "m" are defective by using the tests FN1 through FN7.

FIG. 3 shows that defects in the defect detection object parts b, d and e can be detected by performing the test FN1 using 50 test patterns, and defects in the defect detection object parts d, f and i can be detected by performing the test FN2 using 50 test patterns. In the same manner as above, defects in the defect detection object parts a, b, d, e, f, g, h, i, j and k can be detected by the tests FN3 through FN7.

Turning now to FIG. 1 again, the test pattern generating unit 1 generates a group of test patterns A, B, . . . of one test after the flip-flops of the LSI circuit are reset by the reset signal RESET as shown in FIG. 2, and outputs these test patterns to the LSI simulator 2. The LSI simulator 2 receives the test patterns generated by the test pattern generator 1, and generates resultant output patterns, which are supplied to the test pattern decision unit 4. The test pattern decision unit 4 refers to the simulation result file 3 which stores the output patterns obtained when the test patterns of the tests are applied to the LSI simulator 2 beforehand, and outputs the defect detection results. For example, in the test named FN1 shown in FIG. 3, the test pattern decision unit 4 refers to the simulation result file 3, and confirms the detection of the defect detection parts b, d and e.

Normally, the tests FN1 through FN7 are designed to detect the respective object defects. When it is confirmed that a group of test patterns of a test can be used to detect the object defect, the test pattern generator 1 is designed to generate the group of test patterns. If a test having a group of test patterns more efficient than the tests FN1 through FN7 is created, the above test is added to the existing tests FN1 through FN7. In the above manner, new test patterns more efficient than the existing test patterns are added thereto.

In the above case, there is a possibility that some existing patterns may be meaningless due to the added efficient test patterns. There is also a possibility that a defective part is detected a plurality of number of times by different tests. Normally, all the tests are performed by using the respective test patterns, and hence it tales a long time to complete the test of the LSI circuit.

SUMMARY OF THE INVENTION

It is a general object of the present invention to provide a method and device for generating test patterns in which the above disadvantages are eliminated.

A more specific object of the present invention is to provide a method and device for efficiently generating a reduced number of test patterns making it possible to efficiently detect a defect in an LSI circuit without decrease in the reliability in defect detection.

The above objects of the present invention are achieved by a method for generating test patterns for testing an integrated circuit, the method comprising the steps of:

(a) applying a plurality of groups of test patterns to predetermined parts of an integrated circuit so that one group of test patterns is applied thereto each time the integrated circuit is reset and detecting defect detection object parts of the integrated circuit;

(b) identifying one or a plurality of unnecessary groups of test patterns among the plurality of groups of test patterns by referring to the defect detection object parts detected by the plurality of groups of test patterns; and (c) deleting the above one or plurality of unnecessary groups of test patterns from the plurality of groups of test patterns, so that remaining groups of test patterns are used to test an integrated circuit to be tested.

Preferably, the step (b) comprises the steps of: (b-1) determining whether or not there is a defect detection object part of the integrated circuit detected by only one of the groups of test patterns; and (b-2) deleting a group of test patterns detecting defect detection object parts which are all detected by the only one of the group of test patterns.

Preferably, the step (b) comprises the steps of: (b-3) determining, when a result of the step (b-1) is negative, whether or not there are groups of test patterns respectively detecting defect detection object parts which can be detected by other groups of test patterns among the plurality of groups of test patterns; and (b-4) selecting one of the groups of test patterns having a smallest number of patterns and deleting remaining groups of test patterns respectively detecting defect detection object parts which can be detected by the other groups of test patterns.

Preferably, the step (b) comprises the steps of: (b-3) determining, before the step (b-1), whether or not there is a group of test patterns which cannot detect any defect detection object part; and (b-4) deleting the group of test patterns which cannot detect any defect detection object part.

The above objects of the present invention are also achieved by a device for generating test patterns for testing an integrated circuit, comprising:

first means for applying a plurality of groups of test patterns to predetermined parts of an integrated circuit so that one group of test patterns is applied thereto each time the integrated circuit is reset and detecting defect detection object parts of the integrated circuit;

second means for identifying one or a plurality of unnecessary groups of test patterns among the plurality of groups of test patterns by referring to the defect detection object parts detected by the plurality of groups of test patterns; and third means for deleting the above one or plurality of unnecessary groups of test patterns from the plurality of groups of test patterns, so that remaining groups of test patterns are used to test an integrated circuit to be tested.

BRIEF DESCRIPTION OF THE DRAWINGS

Other objects, features and advantages of the present invention will become more apparent from the following detailed description when read in conjunction with the accompanying drawings in which:

FIG. 3 is a diagram showing test patterns and defect detection object parts;

FIG. 7 is a diagram showing a decision making procedure for determining whether a test pattern group is valid or invalid; and FIG. 8 is another diagram showing the decision making procedure for determining whether a test pattern group is valid or invalid.

DESCRIPTION OF THE PREFERRED EMBODIMENT

Figure 4:
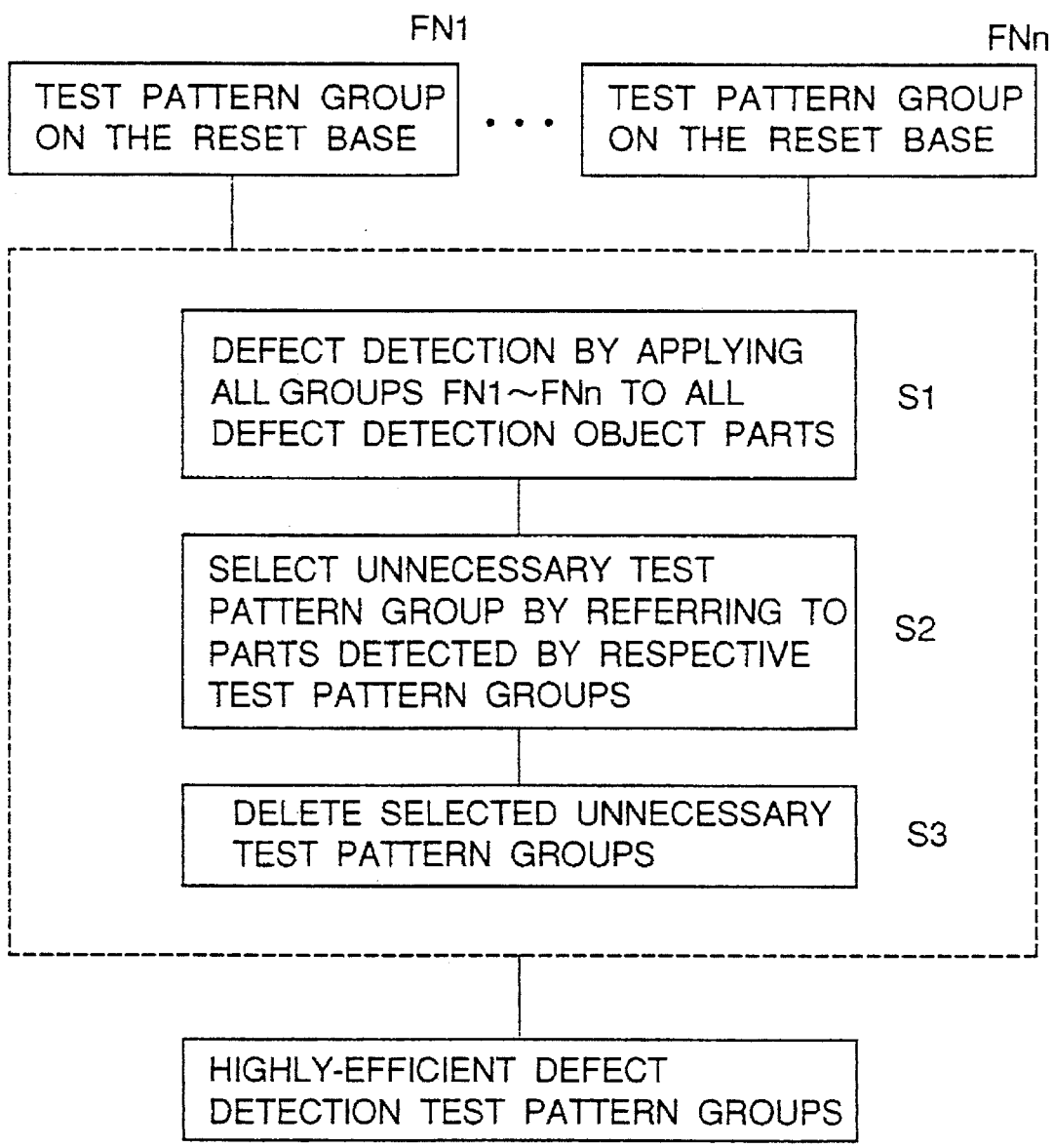
FIG. 4 is a flowchart of the principle of the present invention.

FIG. 4 is a flowchart of the principle of the present invention. First, a plurality of groups (tests) FN1–FNn of test patterns are prepared. Each of the groups FN1–FNn has test patterns to be applied to an LSI simulator after the LSI simulator is reset by a reset signal for initialization. Each of the groups FN1–FNn is applied to all defect detection object parts in step S1. In step S2, one or a plurality of unnecessary groups of test patterns are identified on the basis of parts in the LSI circuit detected by the test patterns. In step S3, the above one or plurality of unnecessary groups of test patterns are deleted. Hence, the LSI circuit can be tested by the remaining groups of test patterns, so that the number of test patterns can be reduced and the test can be efficiently performed.

Figure 5:
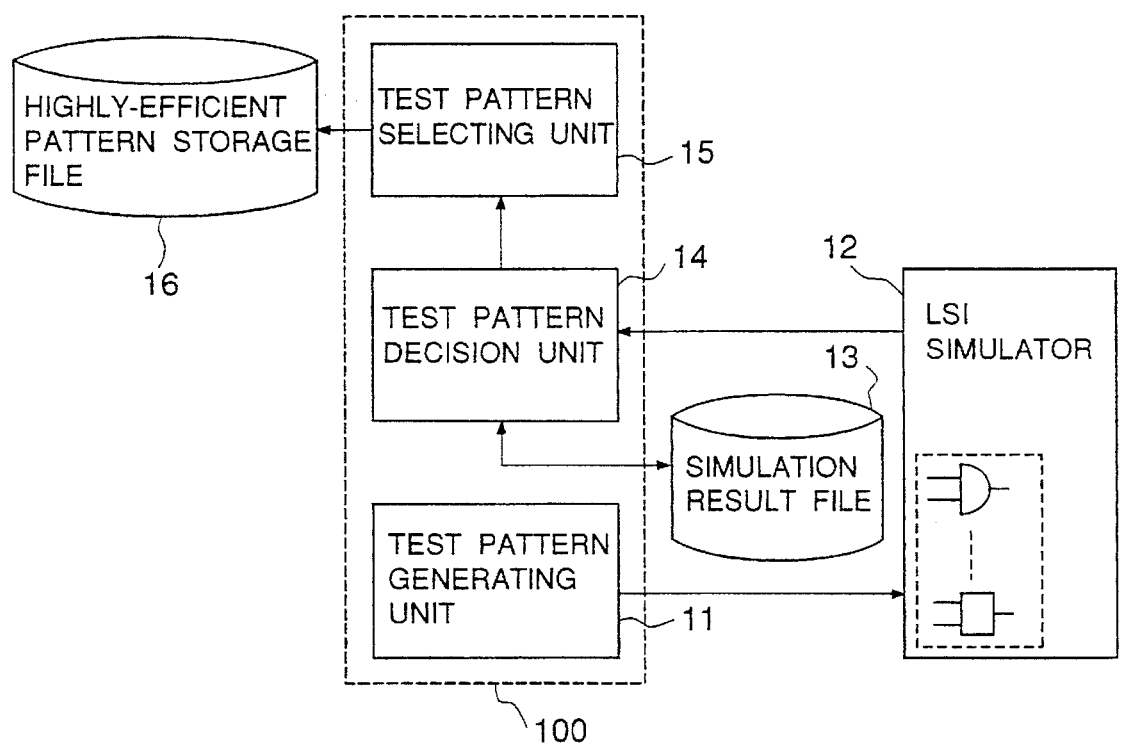
FIG. 5 is a block diagram of a test pattern generating device according to an embodiment of the present invention.

FIG. 5 is a block diagram of a device for generating test patterns for a testing an LSI circuit. The device shown in FIG. 5 is made up of a test pattern generating unit 11, an LSI simulator 12, a simulation result file 13, a test pattern decision unit 14, a test pattern selecting unit 15, and a highly-efficient test pattern storage file 16. The test pattern generating unit 11, the test pattern decision unit 14 and the test pattern selecting unit 15 can be realized by, for example, a CPU (Central Processing Unit) 100. The test pattern selecting unit 15 selects one or a plurality of groups of test patterns on the basis of the decision results output by the test pattern decision unit 14. The selected one or groups of test patterns are stored, as highly-efficient test patterns, in the highly-efficient test pattern storage file 16. The test of an LSI is performed by using the highly-efficient test patterns stored in the highly-efficient test pattern storage file 16.

Figure 6:
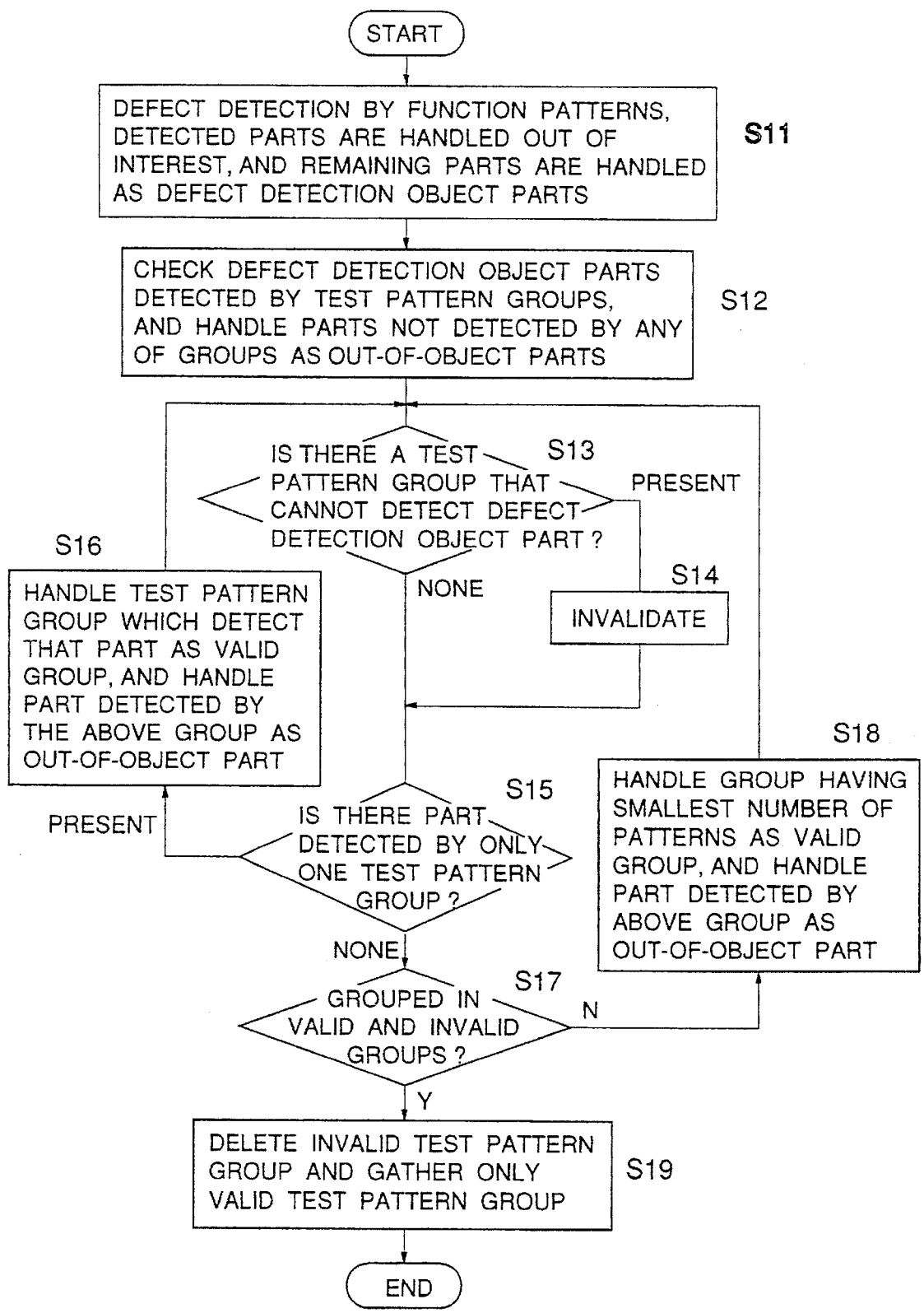
FIG. 6 is a flowchart of a process executed in the embodiment of the present invention shown in FIG. 5.

FIG. 6 is a flowchart of the process by the test pattern selecting unit 15 shown in FIG. 5. In short, function patterns (which are patterns not to be deleted) for testing the original functions of the LSI circuit to be tested are applied to the LSI simulator 12, and parts of the LSI circuit are detected on the basis of the resultant output signals of the LSI simulator 12. The normal parts of the LSI circuit detected by the function patterns are placed out of the object parts to be detected by the test patterns, and the remaining parts are handled as defect detection object parts. Next, a plurality of groups of test patterns are prepared, and each of these groups of test patterns is applied to all the defect detection object parts of the LSI circuit simulated by the LSI simulator 12. Then, it is determined whether or not there are one or a plurality of defective parts each time the LSI circuit is reset and then one group of test patterns is applied to the LSI circuit. On the basis of the output signals of the LSI simulator 12, it is determined whether or not the group of test patterns being considered is valid. Finally, the groups of test patterns which are determined to be valid are stored in the highly-efficient test pattern storage file 6.

FIGS. 7 and 8 show a decision as to whether groups (tests) of test patterns are valid or invalid. A description will now be given, with reference to these figures, of the flowchart of FIG. 6.

In step S11, the function patterns are applied to the LSI circuit simulated by the LSI simulator 12. Out of the defect detectable parts, the normal parts detected by the function patterns are handled as out-of-object parts, and the remaining parts are handled as defect detection object parts.

It will now be assumed that there are 26 defect detection object parts "a"–"z" and that 13 parts out of the 26 parts are detected by the function patterns and 13 remaining parts are handled as defect detection object parts. Further, in step S12, the groups FN1–FN7 of test patterns grouped on the initialization reset base are applied to the LSI circuit one by one. Then, the parts detected by the groups FN1–FN7 of test patterns are checked. The parts that are not detected by the test pattern groups FN1–FN7 are handled as out-of-object parts. It will now be assumed that parts indicated by symbols "o" shown in FIG. 3 are detected by the test pattern groups FN1–FN7. It will be noted that parts c, g, l and m are handled as out-of-object parts because none of the test pattern groups FN1–FN7 could detect these parts.

Figure 1:
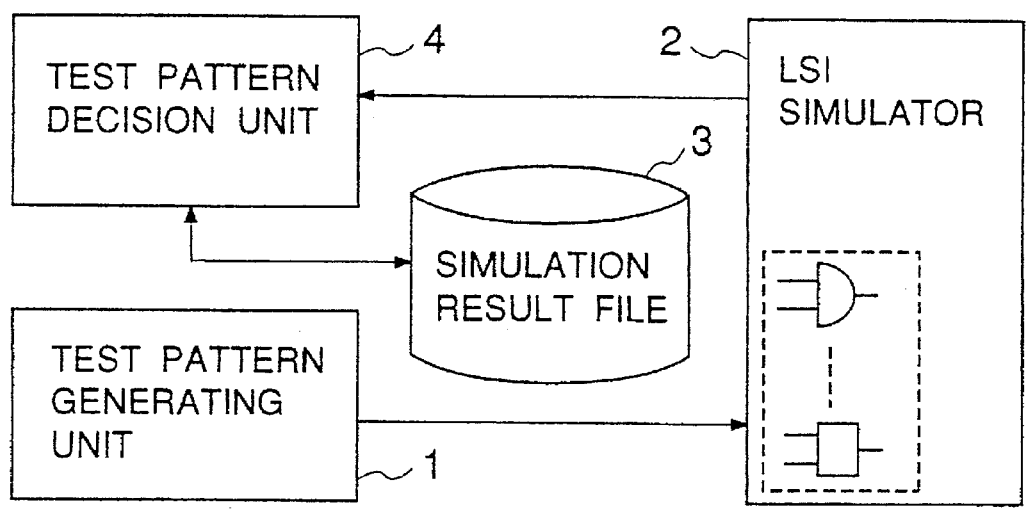
FIG. 1 is a block diagram of a conventional test pattern generating device.
Figure 2:
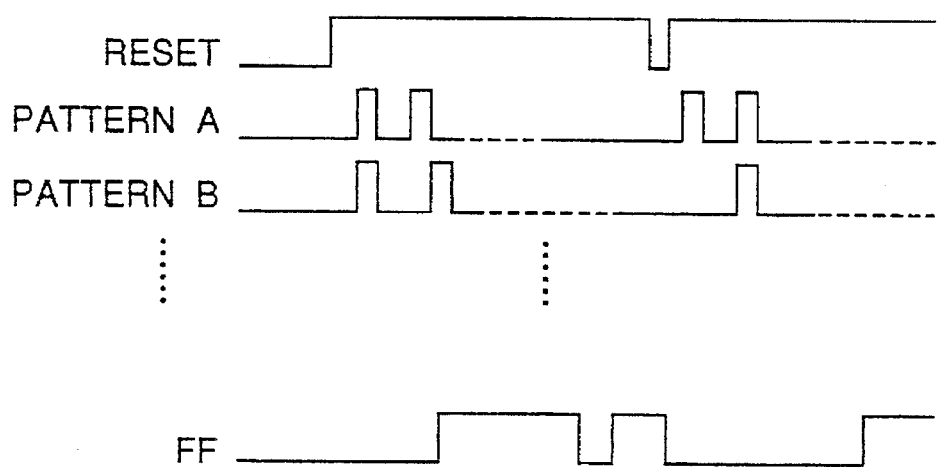
FIG. 2 is a waveform diagram of the operation of the test pattern generating device shown in FIG. 1.

In step S13, it is determined whether or not there is a test pattern group which could not detect any defect detection object part. If there is such a test pattern group, this test pattern group is invalidated in step S14, and the process proceeds to step S15. In the example shown in FIG. 2, the test pattern group FN4 cannot detect any defect detection object part and is thus invalidated.

If it is determined, in step S13, that there is no test pattern group which could not detect any defect detection object part, it is determined, in step S15, whether there is a part detected by only a single test pattern group. If there is a part detected by only a single test pattern group, this test pattern group is handled as a valid test pattern group. One or a plurality of parts detected by the above valid test pattern group are handled as out-of-object parts, and step S13 is performed again in which the remaining parts are handled as defect detection object parts.

If it is determined, in step S15, that there is no part detected by only a single test pattern, the process proceeds to step S17 in which it is determined whether each of all the test pattern groups has been determined as a valid test pattern group or as an invalid test pattern group. When the result of step S17 is YES, step S19 is executed. When the result of step S17 is NO, the process proceeds to step S18 in which only the shortest test pattern group (the group of a minimum number of test patterns) is handled as a valid test pattern group and one or a plurality of parts which can be detected by the above shortest test pattern group are handled as out-of-object parts. Then, the remaining parts are handled as defect detection object parts, and then step S13 is executed again. If there are a plurality of shortest test pattern groups, the group created prior to the other shortest test pattern group is handled as a valid group.

In the example shown in FIG. 3, the defect detection object part "a" is detected by only the test pattern group FN7, and the defect detection object part "h" is detected by only the test pattern group FN5. Hence, as shown in FIG. 7, the test pattern groups FN5 and FN7 are handled as valid test pattern groups. The defect detection object parts "a", "b", "d", "e", "f", "h" and "i" detected by the test pattern groups FN5 and FN7 are out-of-object parts, and hence the remaining defect detection object parts are "j" and "k".

Out of the remaining test pattern groups FN1, FN2, FN3 and FN6, the test pattern groups FN1 and FN2 cannot detect any defect detection parts, and are handled as invalid test pattern groups. Each of the remaining defect detection object parts "j" and "k" cannot be detected by only one test patter group. At this time, the test pattern groups FN3 and FN6 remain.

Thus, the number of the test pattern group FN3 is compared with the number of test pattern group FN6. The test pattern group FN3 includes 30 test patterns, while the test pattern group FN6 includes 40 test patterns. Hence, the test pattern group FN3 is handled as a valid test pattern group, and the test pattern group FN6 is handled as an out-of-object test pattern group.

In the above procedure, as shown in FIG. 8, each of all the test pattern groups except for the test pattern group FN6 is grouped in a valid test pattern group or an invalid test pattern group. The remaining test pattern group FN6 does not detect any defect detection parts, and is therefore handled as an invalid test pattern group.

As a result, each of the test pattern groups is grouped into a valid test pattern group or an invalid test pattern group. In step S19, the invalid test pattern groups are deleted, and only the valid test pattern groups are grouped. In the example shown in FIGS. 2, 7 and 8, the test pattern groups FN3, FN5 and FN7 are handled as valid test pattern groups.

According to the present invention, unnecessary test pattern groups are identified and deleted, so that the remaining test pattern groups can efficiently test the LSI circuit. Hence, the amount of data forming the test patterns can be reduced and the time necessary to complete the simulation can be reduced. As a result, it becomes unnecessary to apply redundant test patterns longer over the sufficient data length to the LSI circuit, particularly when the LSI circuit is slightly modified and the remaking operation of the LSI circuit can be facilitated.

The present invention is not limited to the specifically disclosed embodiment, and variations and modifications may be made without departing from the scope of the present invention.

What is claimed:

1. A method of selecting test patterns of a plurality of groups of test patterns for testing parts of an integrated circuit, the integrated circuit being resettable to initial settings, said method comprising the steps of:

(a) applying the plurality of groups of test patterns to the parts of the integrated circuit so that one group of test patterns is applied each time the integrated circuit is reset to determine parts of the integrated circuit detected by the plurality of groups of test patterns;

(b) identifying unnecessary groups of test patterns among the plurality of groups of test patterns by referring to the parts detected by the plurality of groups of test patterns; and (c) deleting said identified unnecessary groups of test patterns from the plurality of groups of test patterns, the remaining groups of test patterns forming a set of test patterns for testing the integrated circuit, wherein the step (b) comprises the steps of (b-1) determining whether there are any respective parts of the integrated circuit detected by only one of the groups of test patterns, (b-2) when the step (b-1) determines that there are respective parts which are detected by only one of the groups of test patterns, identifying as necessary each of said groups of test patterns detecting a part determined in step (b-1) and identifying as unnecessary each group of test patterns detecting a part of the integrated circuit which is detected by a group of test patterns identified as necessary, (b-3) determining, before the step (b-1), whether there are any groups of test patterns which cannot detect any part of the integrated circuits, and (b-4) when the step (b-3) determines that there is a group of test patterns, identifying as unnecessary each group of test patterns determined in step (b-3) to be unable to detect a part.

2. The method as claimed in claim 1, wherein the step (b) further comprises the steps of:

(b-5) determining, when the step (b-1) determines that there is not a part detected by only one of the groups of test patterns, whether there are groups of test patterns which are not identified as one of necessary and unnecessary and that detect parts of the integrated circuit which can be detected by other groups of test patterns among said plurality of groups of test patterns which are not identified as one of necessary and unnecessary; and (b-6) selecting, when said step (b-5) determines that there are groups of test patterns, a group of the groups of test patterns determined in said step (b-5) and having the smallest number of patterns, identifying as necessary the selected group of test patterns and identifying as unnecessary the remaining groups of test patterns which have not been identified as one of necessary and unnecessary and which detect parts of the integrated circuit which can be detected by the groups of test patterns identified as necessary.

3. A device for selecting test patterns of a plurality of groups of test patterns for testing parts of an integrated circuit, the integrated circuit being resettable to initial settings, the device comprising:

first means for applying the plurality of groups of test patterns to the parts of the integrated circuit so that one group of test patterns is applied each time the integrated circuit is reset to determine parts of the integrated circuit detected by the plurality of groups of test patterns;

second means for identifying unnecessary groups of test patterns among the plurality of groups of test patterns by referring to the parts detected by the plurality of groups of test patterns; and third means for deleting said identified unnecessary groups of test patterns from the plurality of groups of test patterns, the remaining groups of test patterns forming a set of test patterns for testing the integrated circuit, wherein the second means comprises first determining means for determining whether there are any respective parts of the integrated circuit detected by only one of the groups of test patterns, first identifying means for identifying as necessary each of said groups of test patterns detecting a part determined by said first determining means to be a part detected by only one of the groups of test patterns, and for identifying as unnecessary each a group of test patterns detecting a part of the integrated circuit which is detected by a group of test patterns identified as necessary, second determining means for determining, before the first determining means determines, whether there are any groups of test patterns which cannot detect any part of the integrated circuits, and second identifying means for identifying as unnecessary each group of test patterns determined by said second determining means to be a group which cannot detect any part.

4. The device as claimed in claim 3, wherein the second means further comprises:

third determining means for determining, when the first determining means determines that there is not a part detected by only one of the groups of test patterns, whether there are groups of test patterns which are not identified as one of necessary and unnecessary and that detect parts of the integrated circuit which can be detected by other groups of test patterns among said plurality of groups of test patterns which are not identified as one of necessary and unnecessary; and selecting means for selecting a group of the groups of test patterns determined by said third determining means to be a group of test patterns that detect parts and having the smallest number of patterns of each group of test patterns not identified as one of necessary and unnecessary, for identifying as necessary the selected group of test patterns and for identifying as unnecessary the remaining groups of test patterns which have not been identified as one of necessary and unnecessary and which detect parts of the integrated circuit which can be detected by the groups of test patterns identified as necessary.

5. A method of selecting test patterns of a plurality of groups of test patterns for testing parts of an integrated circuit, the method comprising the steps of:

(a) applying the plurality of groups of test patterns to the parts of the integrated circuit to determine parts of the integrated circuit detected by the plurality of groups of test patterns, the parts detected by the plurality of groups forming a group of parts;

(b) selectively identifying each of the groups of test patterns among the plurality of groups of test patterns as one of necessary and unnecessary by repeatedly referring to the group of parts, where the group of parts is reduced each time a respective group of test patterns is determined to be necessary, the group of parts being reduced by the parts detected by the respective group of test patterns determined to be necessary; and (c) eliminating, after each of the groups of test patterns has been identified in step (b), the groups of test patterns identified as unnecessary to form a set of remaining necessary groups of test patterns for testing the integrated circuit, wherein the step (b) comprises the steps of:

(b-1) determining whether there are any respective parts of the group of parts detected by only one of the groups of test patterns, and (b-2) when the step (b-1) determines that there are respective parts of the group of parts which are detected by only one of the groups of test patterns, identifying as necessary each of the groups of test patterns detecting a part determined in step (b-1), eliminating the parts detected by the groups identified as necessary from the group of parts, and then identifying as unnecessary each group of test patterns which does not detect a part in the group of parts, (b-3) determining, before the step (b-1), whether there are any groups of test patterns which cannot detect any part of the group of parts, and (b-4) when the step (b-3) determines that there is a group of test patterns which cannot detect any part of the group of parts, identifying as unnecessary each group of test patterns determined in step (b-3) to be unable to detect a part.

6. The method as claimed in claim 5, wherein the step (b) further comprises the steps of:

(b-5) determining, when the step (b-1) determines that there is not a part in the group of parts detected by only one of the groups of test patterns, whether there are groups of test patterns which are not identified as one of necessary and unnecessary; and (b-6) when the step (b-5) determines that there are groups of test patterns which are not identified as one of necessary and unnecessary, selecting a group of the groups of test patterns which is not identified as one of necessary and unnecessary having the smallest number of patterns, identifying as necessary the selected group of test patterns, eliminating the parts detected by the selected group from the group of parts, and then identifying as unnecessary the remaining groups of test patterns which have not been identified as one of necessary and unnecessary and which do not detect parts in the group of parts.

7. An apparatus which selects test patterns of a plurality of groups of test patterns for testing parts of an integrated circuit, the apparatus comprising:

means for applying the plurality of groups of test patterns to the parts of the integrated circuit to determine parts of the integrated circuit detected by the plurality of groups of test patterns, the parts detected by the plurality of groups forming a group of parts;

means for selectively identifying each of the groups of test patterns among the plurality of groups of test patterns as one of necessary and unnecessary by repeatedly referring to the group of parts, where the group of parts is reduced each time a respective group of test patterns is determined to be necessary, the group of parts being reduced by the parts detected by the respective group of test patterns determined to be necessary; and means for eliminating, after the means for selectively identifying identifies each of the groups of test patterns, the groups of test patterns identified as unnecessary to form a set of remaining necessary groups of test patterns for testing the integrated circuit, wherein the means for selectively identifying comprises first means for determining whether there are any respective parts of the group of parts detected by only one of the groups of test patterns; and second means, when the first means determines that there are respective parts of the group of parts which are detected by only one of the groups of test patterns, for identifying as necessary each of the groups of test patterns detecting a part determined by the first means, for eliminating the parts detected by the groups identified as necessary from the group of parts, and then for identifying as unnecessary each group of test patterns which does not detect a part in the group of parts, third means, before the first means performs a determination, for determining whether there are any groups of test patterns which cannot detect any part of the group of parts, and fourth means, when the first means determines that there is a group of test patterns which cannot detect any part of the group of parts, for identifying as unnecessary each group of test patterns determined to be unable to detect a part.

8. The apparatus as claimed in claim 7, wherein the means for selectively identifying further comprises:

fifth means, when the first means determines that there is not a part in the group of parts detected by only one of the groups of test patterns, for determining whether there are groups of test patterns which are not identified as one of necessary and unnecessary; and sixth means, when the fifth means determines that there are groups of test patterns which are not identified as one of necessary and unnecessary, for selecting a group of the groups of test patterns which are not identified as one of necessary and unnecessary having the smallest number of patterns, for identifying as necessary the selected group of test patterns, for eliminating the parts detected by the selected group from the group of parts, and then for identifying as unnecessary the remaining groups of test patterns which have not been identified as one of necessary and unnecessary and which do not detect parts in the group of parts.

* * * * *

UNITED STATES PATENT AND TRADEMARK OFFICE
CERTIFICATE OF CORRECTION

PATENT NO. : 5,648,975
DATED : July 15, 1997
INVENTOR(S) : DEGUCHI

It is certified that error appears in the above-identified patent and that said Letters Patent is hereby corrected as shown below:

Col. 1,  line 49, change "simulalor" to --simulator--.

Col. 2,  line 29, change "tales" to --takes--.

Col. 5,  line 47, change "patter" to --pattern--.

Col. 6,  line 50 (Claim 1, line 32), change "circuits" to --circuit--.

Col. 7,  line 42 (Claim 3, line 34), change "circuits" to --circuit--.

Signed and Sealed this

Thirtieth Day of December, 1997

Attest:

BRUCE LEHMAN

Attesting Officer

Commissioner of Patents and Trademarks